United States Patent
Shimamune et al.

(10) Patent No.: US 9,882,533 B2
(45) Date of Patent: Jan. 30, 2018

(54) CURRENT OUTPUT CIRCUIT

(71) Applicant: Murata Manufacturing Co., Ltd., Kyoto (JP)

(72) Inventors: Yusuke Shimamune, Kyoto (JP); Satoshi Tanaka, Kyoto (JP); Takayuki Tsutsui, Kyoto (JP); Hayato Nakamura, Kyoto (JP); Kazuhito Nakai, Kyoto (JP); Fuminori Morisawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/274,539

(22) Filed: Sep. 23, 2016

(65) Prior Publication Data

US 2017/0099033 A1  Apr. 6, 2017

(30) Foreign Application Priority Data

Oct. 5, 2015 (JP) .................. 2015-197915

(51) Int. Cl.
*H03F 3/04* (2006.01)
*H03F 1/02* (2006.01)
*H03F 3/193* (2006.01)
*H03F 3/21* (2006.01)
*H03F 3/191* (2006.01)
*H03F 1/30* (2006.01)

(52) U.S. Cl.
CPC ......... *H03F 1/0222* (2013.01); *H03F 1/302* (2013.01); *H03F 3/191* (2013.01); *H03F 3/193* (2013.01); *H03F 3/21* (2013.01); *H03F 1/301* (2013.01); *H03F 3/04* (2013.01); *H03F 2200/18* (2013.01); *H03F 2200/451* (2013.01)

(58) Field of Classification Search
CPC .......... H03F 1/0222; H03F 3/193; H03F 3/21
USPC ...................... 330/285, 296, 297
See application file for complete search history.

(56) References Cited

U.S. PATENT DOCUMENTS

| | | | | |
|---|---|---|---|---|
| 6,566,944 B1 * | 5/2003 | Pehlke | ................. | H03F 1/0233 330/10 |
| 7,193,474 B2 * | 3/2007 | Phillips | ................. | H03F 1/0211 330/298 |
| 7,333,778 B2 * | 2/2008 | Pehlke | ................. | H03C 1/06 330/10 |

(Continued)

FOREIGN PATENT DOCUMENTS

| | | |
|---|---|---|
| JP | H11-186854 A | 7/1999 |
| JP | 2005-217557 A | 8/2005 |

(Continued)

*Primary Examiner* — Khanh V Nguyen
(74) *Attorney, Agent, or Firm* — Pearne & Gordon LLP (57) ABSTRACT

Provided is a current output circuit that includes: a first FET that has a power supply voltage supplied to a source thereof, that has a first voltage supplied to a gate thereof and that outputs a first current from a drain thereof; a second FET that has the power supply voltage supplied to a source thereof, that has the first voltage supplied to a gate thereof and that outputs an output current from a drain thereof; a first control circuit that controls the first voltage such that the first current comes to be at a target level; and a second control circuit that performs control such that a drain voltage of the first FET and a drain voltage of the second FET are made equal to each other.

14 Claims, 7 Drawing Sheets

(56) References Cited

U.S. PATENT DOCUMENTS

| | | | | |
|---|---|---|---|---|
| 7,839,218 | B2* | 11/2010 | Shimamoto | H03F 1/0216 330/297 |
| 7,937,049 | B2* | 5/2011 | Phillips | H03F 1/0205 455/114.3 |
| 9,287,832 | B2* | 3/2016 | Hagisawa | H03F 1/30 |
| 2011/0025422 | A1 | 2/2011 | Marra et al. | |
| 2014/0253243 | A1 | 9/2014 | Hagisawa | |

FOREIGN PATENT DOCUMENTS

| JP | 2014-078973 A | 5/2014 |
|---|---|---|
| JP | 2014-090445 A | 5/2014 |

\* cited by examiner

CURRENT OUTPUT CIRCUIT

This application claims priority from Japanese Patent Application No. 2015-197915 filed on Oct. 5, 2015. The contents of this application are incorporated herein by reference in its entirety.

BACKGROUND

The present disclosure relates to a current output circuit. In a power amplification module, a circuit that generates a prescribed output current is used in order to supply a bias current to a power amplifier. For example, in a circuit disclosed in Japanese Unexamined Patent Application Publication No. 11-186854, an output current is generated by using a current mirror circuit. Specifically, a voltage corresponding to a power supply voltage is applied to the drain of a diode-connected MOS transistor and an output current is output from the drain of a MOS transistor that is connected to the MOS transistor current mirror manner.

If the actual use conditions of a power amplification module are considered, there is a possibility that the power supply voltage will vary. Consequently, it is demanded that a stable output current be generated regardless of variations in the power supply voltage in order that a stable bias current be supplied in the power amplification module.

However, in the circuit disclosed in Japanese Unexamined Patent Application Publication No. 11-186854, the size of the output current depends upon the value of the applied power supply voltage. Consequently, there is a possibility that the output current will also vary with variations in the value of the power supply voltage.

BRIEF SUMMARY

The present disclosure was made in light of the above-described circumstances and provides a current output circuit that can stably output a current regardless of variations in the power supply voltage.

In order to achieve this object, a current output circuit according to an embodiment of the present disclosure includes: a first FET that has a power supply voltage supplied to a source thereof, that has a first voltage supplied to a gate thereof and that outputs a first current from a drain thereof; a second FET that has the power supply voltage supplied to a source thereof, that has the first voltage supplied to a gate thereof and that outputs an output current from a drain thereof; a first control circuit that controls the first voltage such that the first current comes to be at a target level; and a second control circuit that performs control such that a drain voltage of the first FET and a drain voltage of the second FET are made equal to each other.

According to the embodiment of the present disclosure, a current output circuit can be provided that can stably output a current regardless of variations in the power supply voltage.

Other features, elements, characteristics and advantages of the present disclosure will become more apparent from the following detailed description of embodiments of the present disclosure with reference to the attached drawings.

DETAILED DESCRIPTION

Hereafter, embodiments of the present disclosure will be described in detail while referring to the drawings. In addition, elements that are the same as each other will be denoted by the same symbols and repeated description thereof will be omitted.

Figure 1:
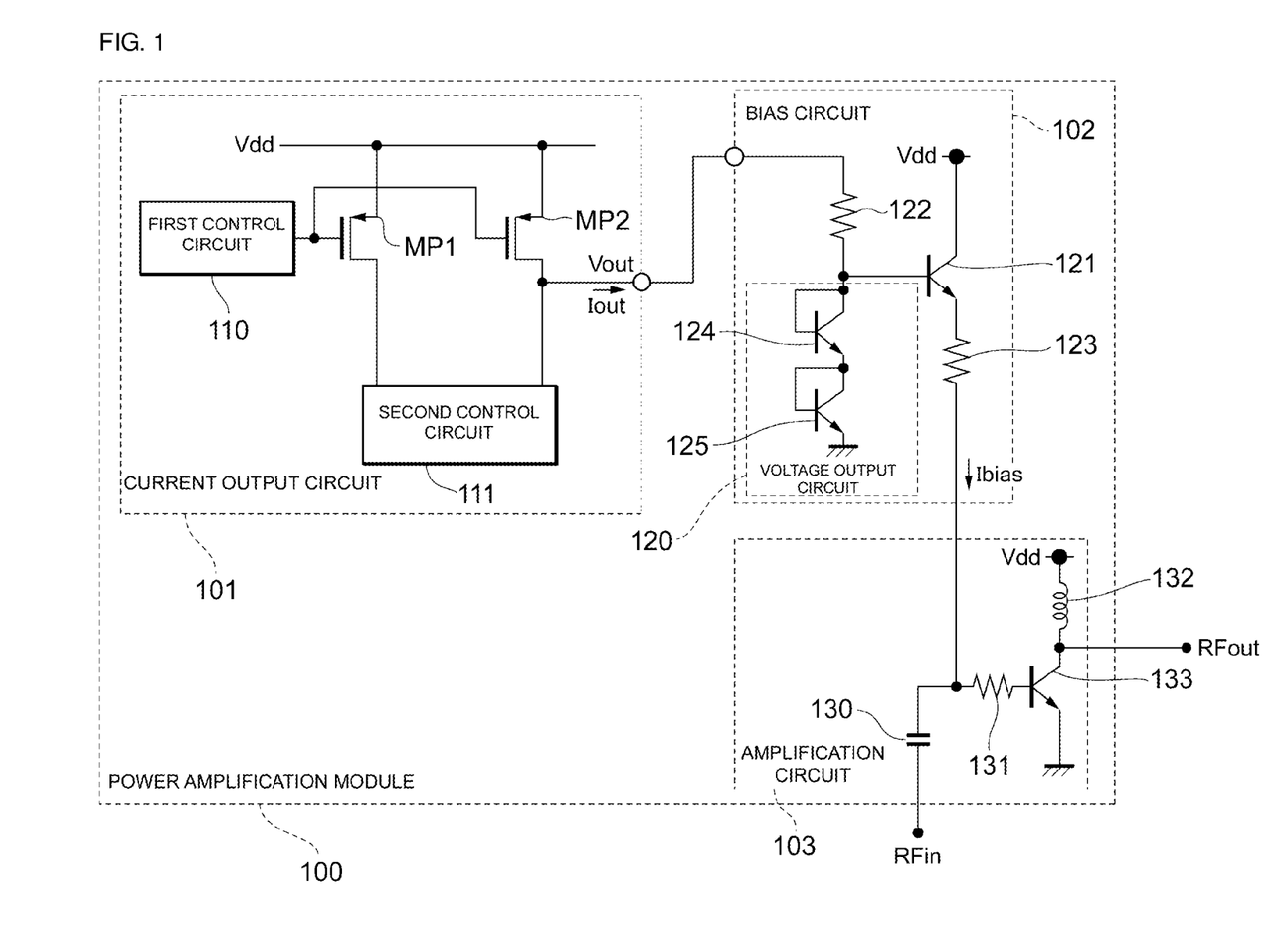
FIG. 1 illustrates an example configuration of a power amplification module that includes a current output circuit according to an embodiment of the present disclosure.

FIG. 1 illustrates an example configuration of a power amplification module that includes a current output circuit according to an embodiment of the present disclosure.

As illustrated in FIG. 1, a power amplification module 100 includes a current output circuit 101, a bias circuit 102 and an amplification circuit 103.

The current output circuit 101 is supplied with a power supply voltage Vdd and generates an output current Iout of a target level. The output current Iout is supplied to the bias circuit 102.

The current output circuit 101 includes p-channel MOSFETs (MP1 and MP2) and first and second control circuits 110 and 111.

The p-channel MOSFET (MP1) (first FET) has the power supply voltage Vdd supplied to the source thereof, the gate thereof is connected to the first control circuit 110 and the drain thereof is connected to the second control circuit 111.

The p-channel MOSFET (MP2) (second FET) has the power supply voltage Vdd supplied to the source thereof, the gate thereof is connected to the gate of the p-channel MOSFET (MP1) and the drain thereof is connected to the second control circuit 111. Thus, the p-channel MOSFET (MP2) is connected so as to have a common gate potential with the p-channel MOSFET (MP1). Therefore, the current density of the p-channel MOSFET (MP2) can be made the same as that of the p-channel MOSFET (MP1).

The first control circuit 110 controls the gate voltages of the p-channel MOSFETs (MP1 and MP2) so that the output current Iout is at the target level. The second control circuit 111 performs control to make the drain voltages of the p-channel MOSFETs (MP1 and MP2) equal to each other. An output current Iout of the target level is output from the drain of the p-channel MOSFET (MP2) as a result of the control performed by the first and second control circuits 110 and 111. The details of the configurations of the first and second control circuits 110 and 111 will be described later.

The bias circuit 102 generates a bias current Ibias of a size corresponding to the output current Iout output from the current output circuit 101. The bias current Ibias is supplied to the amplification circuit 103.

The bias circuit 102 includes a voltage output circuit 120, a bipolar transistor 121 and resistance elements 122 and 123.

The voltage output circuit 120 outputs a voltage of a prescribed level (fourth voltage) on the basis of the output current Iout supplied from the current output circuit 101. The voltage output circuit 120 includes bipolar transistors 124 and 125, for example. The collector and base of the bipolar transistor 124 are connected to each other (hereafter, referred to as being "diode connected"), the collector of the bipolar transistor 124 is connected to a second terminal of the resistance element 122 and to the base of the bipolar transistor 121, and the emitter of the bipolar transistor 124 is connected to the collector of the bipolar transistor 125. The bipolar transistor 125 is diode connected, the collector thereof is connected to the emitter of the bipolar transistor 124 and the emitter thereof is grounded. Thus, a voltage of a prescribed level (for example, around 2.6 V) is generated at the collector of the bipolar transistor 124.

The bipolar transistor 121 (second bipolar transistor) has the power supply voltage Vdd supplied to the collector thereof, the base thereof is connected to the second terminal of the resistance element 122 and to the collector of the bipolar transistor 124, and the emitter thereof is connected to a first terminal of the resistance element 123. The output current Iout output from the current output circuit 101 and the voltage output from the voltage output circuit 120 are supplied to the base of the bipolar transistor 121. Thus, a bias current Ibias that corresponds to the output current Iout is output from the emitter of the bipolar transistor 121.

The output current Iout is supplied to a first terminal of the resistance element 122 and the second terminal of the resistance element 122 is connected to the collector of the bipolar transistor 124 and to the base of the bipolar transistor 121.

The first terminal of the resistance element 123 is connected to the emitter of the bipolar transistor 121 and a second terminal of the resistance element 123 is connected to the amplification circuit 103.

The amplification circuit 103 amplifies a radio frequency (RF) signal RFin (input signal) up to the level that is required to transmit the signal to a base station and outputs an amplified signal RFout (output signal).

As illustrated in FIG. 1, the amplification circuit 103 includes, for example, a capacitance element 130, a resistance element 131, an inductor 132 and a bipolar transistor 133.

The radio frequency signal RFin is supplied to a first terminal of the capacitance element 130 from outside the amplification circuit 103 and a second terminal of the capacitance element 130 is connected to a first terminal of the resistance element 131. The capacitance element 130 removes a direct-current component of the radio frequency signal RFin.

The first terminal of the resistance element 131 is connected to the second terminal of the capacitance element 130 and to the second terminal of the resistance element 123 and a second terminal of the resistance element 131 is connected to the base of the bipolar transistor 133.

The power supply voltage Vdd is supplied to a first terminal of the inductor 132 and a second terminal of the inductor 132 is connected to the collector of the bipolar transistor 133.

The bipolar transistor 133 (first bipolar transistor) has the power supply voltage Vdd supplied to the collector thereof via the inductor 132, the base thereof is connected to the second terminal of the resistance element 131 and the emitter thereof is grounded. The radio frequency signal RFin supplied from outside the amplification circuit 103 and the bias current Ibias output from the bias circuit 102 are supplied to the base of the bipolar transistor 133. Thus, the amplified signal RFout, which is obtained by amplifying the radio frequency signal RFin, is output from the collector of the bipolar transistor 133. The gain in the amplification circuit 103 is controlled using the bias current Ibias supplied from the bias circuit 102.

Hereafter, the configurations of the first and second control circuits 110 and 111 of the current output circuit 101 will be described in detail.

First Embodiment

Figure 2:
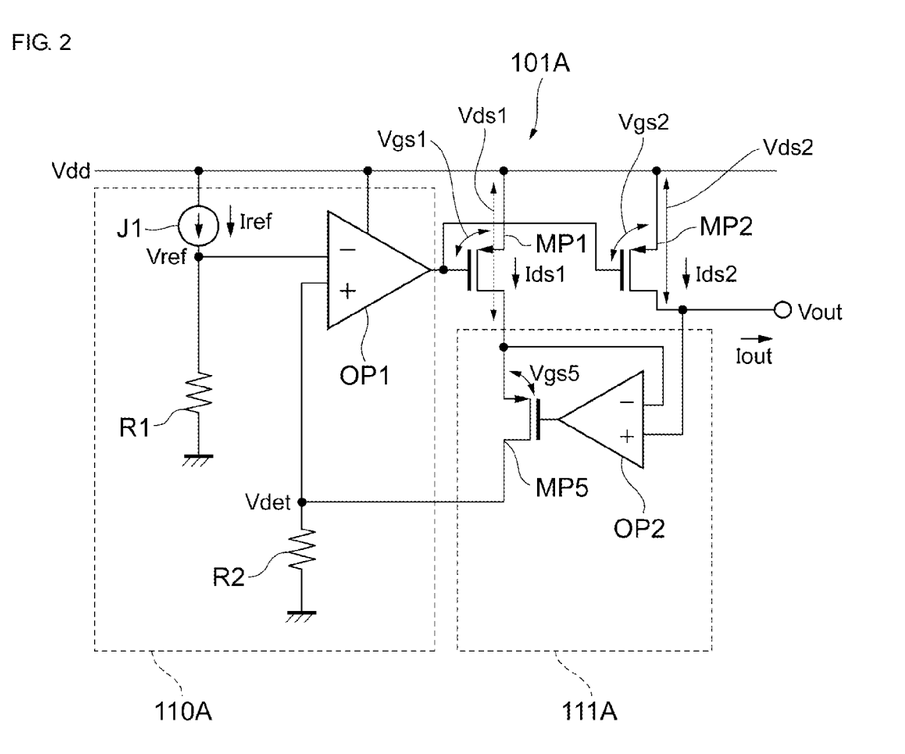
FIG. 2 is a circuit diagram of a current output circuit according to a first embodiment of the present disclosure.

FIG. 2 illustrates a current output circuit 101A as an example of the current output circuit 101. The current output circuit 101A includes a first control circuit 110A and a second control circuit 111A.

The first control circuit 110A includes an operational amplifier OP1, a current source J1 and resistance elements R1 and R2.

The second control circuit 111A includes a p-channel MOSFET (MP5) and an operational amplifier OP2.

The current source J1 generates a reference current Iref, which is a constant current. The current source J1 may change the size of the reference current Iref in accordance with a signal input from outside the current output circuit 101A.

The reference current Iref is supplied to a first terminal of the resistance element R1 and a second terminal of the resistance element R1 is grounded. A reference voltage Vref that corresponds to the reference current Iref is generated at the first terminal of the resistance element R1.

A first terminal of the resistance element R2 is connected to the drain of the p-channel MOSFET (MP5) and a second terminal of the resistance element R2 is grounded. A voltage Vdet (second voltage) that corresponds to a current Ids1 (first current) that flows through the p-channel MOSFET (MP1) is generated at the first terminal of the resistance element R2.

The reference voltage Vref is supplied to an inverting input terminal of the operational amplifier OP1 (first operational amplifier), the voltage Vdet is supplied to a non-inverting input terminal of the operational amplifier OP1 and an output terminal of the operational amplifier OP1 is connected to the gates of the p-channel MOSFETs (MP1 and MP2). The operational amplifier OP1 controls the gate voltages of the p-channel MOSFETs (MP1 and MP2) so that the voltage Vdet becomes equal to the reference voltage Vref.

The p-channel MOSFET (MP5) (fifth FET) has the source thereof connected to the drain of the p-channel MOSFET (MP1), the gate thereof connected to an output terminal of the operational amplifier OP2 and the drain thereof connected to the first terminal of the resistance element R2.

The drain voltage of the p-channel MOSFET (MP1) is supplied to the inverting input terminal of the operational amplifier OP2 (second operational amplifier), the drain voltage of the p-channel MOSFET (MP2) is supplied to the non-inverting input terminal of the operational amplifier OP2 and the output terminal of the operational amplifier OP2 is connected to the gate of the p-channel MOSFET (MP5). The operational amplifier OP2 controls the gate voltage of the p-channel MOSFET (MP5) so that the drain voltages of the p-channel MOSFETs (MP1 and MP2) become equal to each other.

Hereafter, the control performed by the first and second control circuits 110A and 111A will be described.

First, the control performed by the first control circuit 110A will be described.

The first control circuit 110A controls the gate voltages of the p-channel MOSFETs (MP1 and MP2) on the basis of the reference voltage Vref corresponding to the reference current Iref. Specifically, the operational amplifier OP1 operates such that the inverting input terminal and the non-inverting input terminal thereof come to be at the same potential.

For example, when the voltage Vdet is lower than the reference voltage Vref as a result of the current Ids1 flowing through the p-channel MOSFET (MP1) being small, the operational amplifier OP1 decreases the output voltage thereof. Consequently, a gate-source voltage Vgs1 of the p-channel MOSFET (MP1) increases and the current Ids1 increases. Conversely, when the voltage Vdet is higher than the reference voltage Vref as a result of the current Ids1 flowing through the p-channel MOSFET (MP1) being large, the operational amplifier OP1 increases the output voltage thereof. Consequently, the gate-source voltage Vgs1 of the p-channel MOSFET (MP1) decreases and the current Ids1 decreases. In this way, the first control circuit 110A performs control in order to make the current Ids1 be of a constant size that corresponds to the reference current Iref.

Before describing the control performed by the second control circuit 111A, a configuration that does not include the second control circuit 111A will be imagined.

The power supply voltage Vdd may vary between 3.0 V and 4.6 V, for example. At this time, a drain-source voltage Vds1 of the p-channel MOSFET (MP1) changes in accordance with the size of the current Ids1 flowing through the p-channel MOSFET (MP1). However, an output voltage Vout, which is the drain voltage of the p-channel MOSFET (MP2), depends on the I-V (current-voltage) characteristics of load elements (for example, bipolar transistors 124 and 125) in the bias circuit 102, which is the destination to which the output current Iout of the p-channel MOSFET (MP2) is supplied, and is 2.8 V, for example. Therefore, for example, the output voltage Vout is 2.8 V when the power supply voltage Vdd is 3.0 V, and the voltage difference therebetween (=drain-source voltage Vds2 of p-channel MOSFET (MP2)) is 3.0 V−2.8 V=0.2 V. Therefore, a difference is generated between the drain-source voltage Vds1 of the p-channel MOSFET (MP1) and the drain-source voltage Vds2 of the p-channel MOSFET (MP2).

Here, the p-channel MOSFETs have a characteristic that, if the gate voltage is fixed, the size of the current suddenly drops when the drain-source voltage falls below a prescribed level. Consequently, if the drain-source voltage Vds2 of the p-channel MOSFET (MP2) falls below the prescribed level with a decrease in the power supply voltage Vdd, the p-channel MOSFET (MP2) will become unable to output an output current Iout of the target level that is proportional to the current Ids1 flowing through the p-channel MOSFET (MP1).

Next, the control performed by the second control circuit 111A will be described.

In the current output circuit 101A, the second control circuit 111A operates so that the drains of the p-channel MOSFETs (MP1 and MP2) come to be at the same potential. In the case where the drain voltage of the p-channel MOSFET (MP2) is higher than the drain voltage of the p-channel MOSFET (MP1), the gate voltage of the p-channel MOSFET (MP5) rises due to control of the operational amplifier OP2. Then, the source voltage of the p-channel MOSFET (MP5) (=drain voltage of p-channel MOSFET (MP1)) rises. Thus, the drain voltage of the p-channel MOSFET (MP1) comes to be at the same level as the drain voltage of the p-channel MOSFET (MP2).

At this time, the drain-source voltage Vds1 of the p-channel MOSFET (MP1) falls due to the increase in the drain voltage of the p-channel MOSFET (MP1). However, the gate voltage of the p-channel MOSFET (MP1) falls due to control of the operational amplifier OP1, and as a result a current Ids1 that corresponds to the reference current Iref flows in the p-channel MOSFET (MP1). Since the gate voltage of the p-channel MOSFET (MP2) also falls, an output current Iout of the target level that is proportional to the current Ids1 flows in the p-channel MOSFET (MP2).

As described above, the first control circuit 110A performs control such that the current Ids1 that flows in the p-channel MOSFET (MP1) has a size that corresponds to the reference current Iref. In addition, the second control circuit 111A performs control such that the drain voltages of the p-channel MOSFETs (MP1 and MP2) come to be at the same potential. Thus, it is possible to provide a current output circuit that can stably output a current regardless of variations in the power supply voltage Vdd.

Furthermore, if the second control circuit 111A were not provided, it would be necessary to use a p-channel MOSFET having a large gate width as the p-channel MOSFET (MP2) in order to stably output a current under conditions where the potential difference between the output voltage Vout and the power supply voltage Vdd is small. However, by using the second control circuit 111A in the current output circuit 101A, the same output current Iout as in a configuration not provided with the second control circuit 111A can be obtained by using a p-channel MOSFET of a small size.

Second Embodiment

Figure 3:
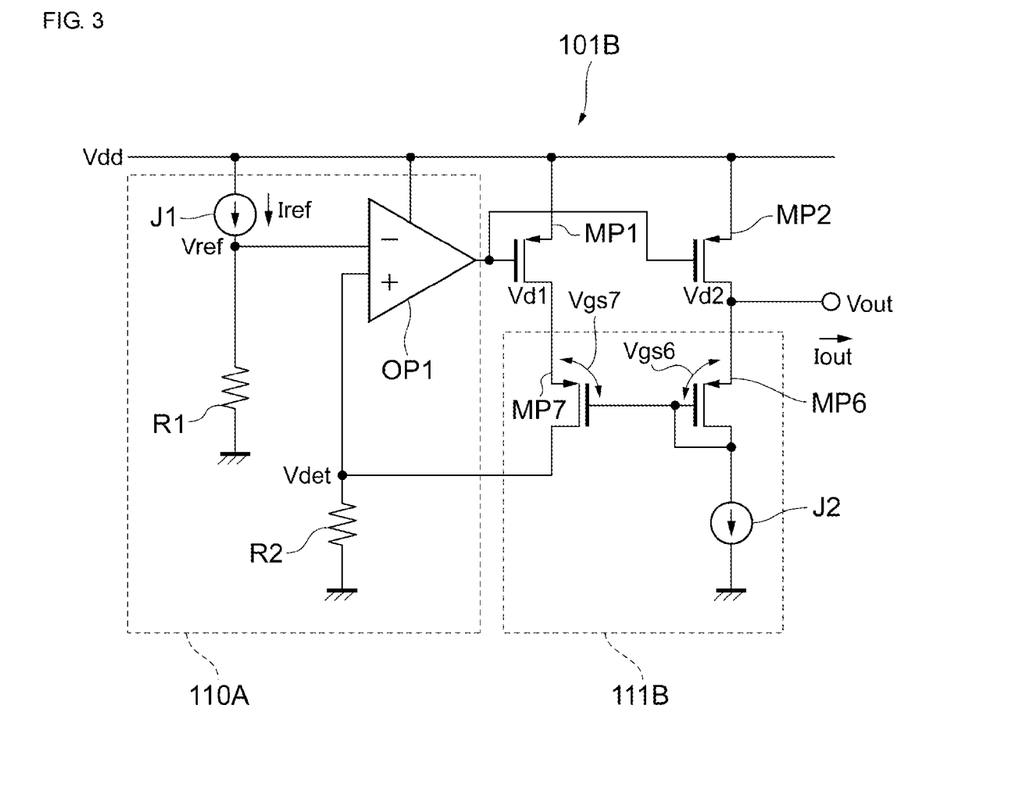
FIG. 3 is a circuit diagram of a current output circuit according to a second embodiment of the present disclosure.

FIG. 3 illustrates a current output circuit 101B as an example of the current output circuit 101. Elements that are the same as those of the current output circuit 101A are denoted by the same symbols and description thereof is omitted. The current output circuit 101B includes a second control circuit 111B instead of the second control circuit 111A of the current output circuit 101A.

The second control circuit 111B includes p-channel MOSFETs (MP6 and MP7) and a current source J2.

The p-channel MOSFET (MP6) (sixth FET) has the source thereof connected to the drain of the p-channel MOSFET (MP2), the gate thereof connected to the drain thereof and the drain thereof connected to the current source J2.

The p-channel MOSFET (MP7) (seventh FET) has the source thereof connected to the drain of the p-channel MOSFET (MP1), the gate thereof connected to the gate of the p-channel MOSFET (MP6) and the drain thereof connected to the first terminal of the resistance element R2. Thus, the p-channel MOSFET (MP7) is connected to the p-channel MOSFET (MP6) in a current mirror manner. Therefore, the current density of the p-channel MOSFET (MP7) can be made the same as that of the p-channel MOSFET (MP6).

The current source J2 outputs a prescribed fixed current (third current).

In the current output circuit 101B as well, the second control circuit 111B operates so that the drain voltages of the p-channel MOSFETs (MP1 and MP2) come to be at the same potential, similarly to as in the current output circuit 101A.

Specifically, if Vd1 and Vd2 represent the drain voltages of the p-channel MOSFETs (MP1 and MP2) and Vgs6 and Vgs7 represent the gate-source voltages of the p-channel MOSFETs (MP6 and MP7), respectively, since the gates of the p-channel MOSFETs (MP6 and MP7) are connected to each other, Vd1−Vgs7=Vd2−Vgs6. Here, in the case where the current densities of the p-channel MOSFETs (MP6 and MP7) are equal to each other, the gate-source voltages Vgs6 and Vgs7 of the p-channel MOSFETs (MP6 and MP7) become equal to each other. Therefore, Vd1=Vd2.

Therefore, in this configuration as well, the drain voltages Vd1 and Vd2 of the p-channel MOSFETs (MP1 and MP2) are maintained at the same potential and the same effect as with the current output circuit 101A can be obtained.

Third Embodiment

Figure 4:
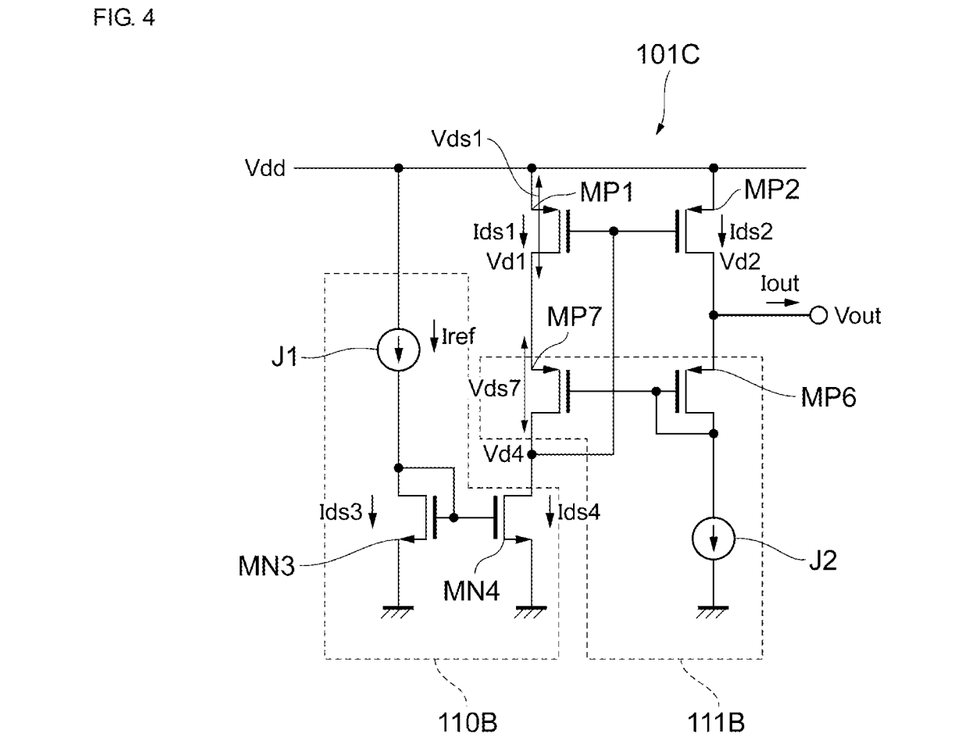
FIG. 4 is a circuit diagram of a current output circuit according to a third embodiment of the present disclosure.

FIG. 4 illustrates a current output circuit 101C as an example of the current output circuit 101. Elements that are the same as those of the current output circuit 101B are denoted by the same symbols and description thereof is omitted. The current output circuit 101C includes a first control circuit 110B instead of the first control circuit 110A of the current output circuit 101B.

The first control circuit 110B includes n-channel MOSFETs (MN3 and MN4) and the current source J1.

The n-channel MOSFET (MN3) (third FET) has the drain thereof connected to the current source J1, the gate thereof connected to the drain thereof, and the source thereof grounded.

The n-channel MOSFET (MN4) (fourth FET) has the drain thereof connected to the drain of the p-channel MOSFET (MP7), the gate thereof connected to the gate of the n-channel MOSFET (MN3) and the source thereof grounded. Thus, the n-channel MOSFET (MN4) is connected to the n-channel MOSFET (MN3) in a current mirror manner. The drain voltage (third voltage) of the n-channel MOSFET (MN3) is supplied to the gates of the n-channel MOSFETs (MN3 and MN4). Furthermore, the gate voltage (first voltage) of the p-channel MOSFETs (MP1 and MP2) is controlled by the drain voltage of the n-channel MOSFET (MN4).

In the first control circuit 110B, the n-channel MOSFET (MN4) is connected to the n-channel MOSFET (MN3) in a current mirror manner when each of the MOSFETs is in a saturated state and therefore a current Ids4 that is proportional to a current (second current) that corresponds to the reference current Iref flows in the n-channel MOSFET (MN4). A current that corresponds to the reference current Iref also flows in the p-channel MOSFET (MP1), which is connected to the n-channel MOSFET (MN4) via the p-channel MOSFET (MP7), and in the p-channel MOSFET (MP2), which is connected to the p-channel MOSFET (MP1) in a mirror current manner.

Furthermore, the drain voltages Vd1 and Vd2 of the p-channel MOSFETs (MP1 and MP2) are maintained at the same potential as described above by operation of the second control circuit 111B. At this time, the drain-source voltage Vds1 of the p-channel MOSFET (MP1) falls due to the increase in the drain voltage Vd1 of the p-channel MOSFET (MP1). However, a drain voltage Vd4 of the n-channel MOSFET (MN4) is supplied to the gates of the p-channel MOSFETs (MP1 and MP2). Here, the drain voltage Vd4 is a voltage that is lower than the drain voltage Vd1 of the p-channel MOSFET (MP1) by the drain-source voltage Vds7 of the p-channel MOSFET (MP7). Therefore, the gate voltages of the p-channel MOSFETs (MP1 and MP2) can be reduced compared with the case where the second control circuit 111B is not provided. Consequently the currents Ids1 and Ids2 flowing in the p-channel MOSFETs (MP1 and MP2) increase and an output current Iout of the target level that is proportional to the current Ids1 is easily obtained.

Therefore, by using a simpler configuration than the current output circuit 101B, the same effect as with the current output circuit 101A can be obtained in this configuration as well.

Fourth Embodiment

Figure 5:
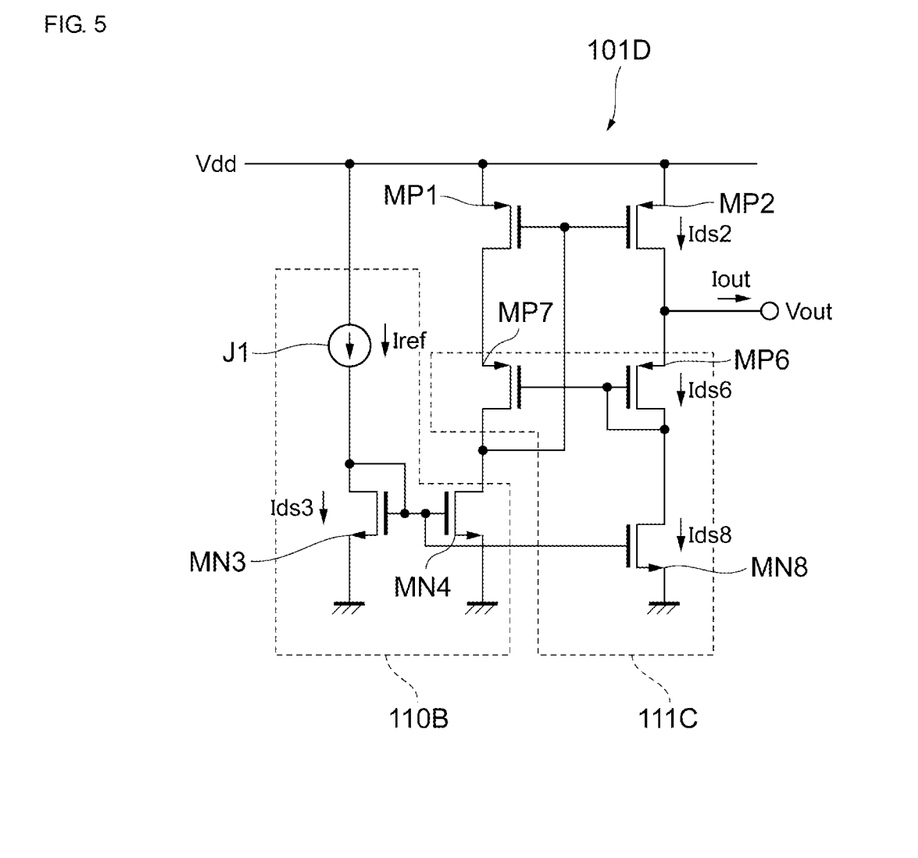
FIG. 5 is a circuit diagram of a current output circuit according to a fourth embodiment of the present disclosure.

FIG. 5 illustrates a current output circuit 101D as an example of the current output circuit 101. Elements that are the same as those of the current output circuit 101C are denoted by the same symbols and description thereof is omitted. The current output circuit 101D includes a second control circuit 111C instead of the second control circuit 111B of the current output circuit 101C.

The configuration of the second control circuit 111C differs from that of the second control circuit 111B illustrated in FIG. 4 in that the second control circuit 111C includes an n-channel MOSFET (MN8) instead of the current source J2.

The n-channel MOSFET (MN8) (eighth FET) has the drain thereof connected to the drain of the p-channel MOSFET (MP6), the gate thereof connected to the gate of the n-channel MOSFET (MN3) and the source thereof grounded. Thus, the n-channel MOSFET (MN8) is connected to the n-channel MOSFET (MN3) in a current mirror manner.

Consequently, a current Ids8 that flows in the n-channel MOSFET (MN8) has a size that corresponds to the reference current Iref. Therefore, the sizes of the currents Ids6 and Ids8 that flow through the p-channel MOSFET (MP6) and the n-channel MOSFET (MN8) are regulated by following the changes in the size of the reference current Iref and the size of the current Ids2 that flows in the p-channel MOSFET (MP2) also changes.

Here, the output current Iout of the current output circuit 101D has a size obtained by subtracting the current Ids6 (≈current Ids8) from the current Ids2 that flows in the p-channel MOSFET (MP2). Therefore, the size of the output current Iout also changes with the change in the size of the reference current Iref.

Therefore, the current output circuit 101D can improve the performance with which the output current Iout follows the reference current Iref when the size of the reference current Iref changes, compared with the current output circuit 101C.

Fifth Embodiment

Figure 6:
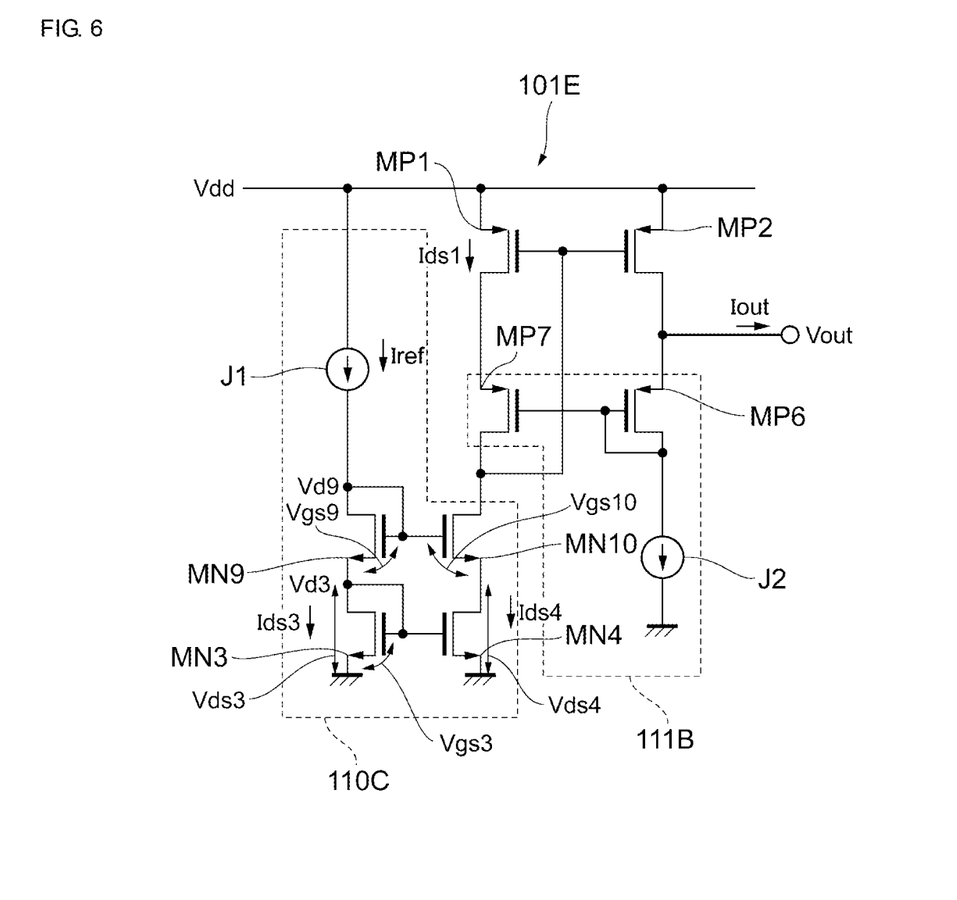
FIG. 6 is a circuit diagram of a current output circuit according to a fifth embodiment of the present disclosure.

FIG. 6 illustrates a current output circuit 101E as an example of the current output circuit 101. Elements that are the same as those of the current output circuit 101C are denoted by the same symbols and description thereof is omitted. The current output circuit 101E includes a first control circuit 110C instead of the first control circuit 110B of the current output circuit 101C.

The configuration of the first control circuit 110C differs from that of the first control circuit 110B illustrated in FIG. 4 in that the first control circuit 110C further includes n-channel MOSFETs (MN9 and MN10).

The n-channel MOSFETs (MN9 and MN10) are arranged so as to be cascode-connected with the n-channel MOSFETs (MN3 and MN4). Specifically, the n-channel MOSFET (MN9) (ninth FET) has the power supply voltage Vdd supplied to the drain thereof, the gate thereof is connected to the drain thereof and the source thereof is connected to the drain of the n-channel MOSFET (MN3).

The n-channel MOSFET (MN10) (tenth FET) has the drain thereof connected to the drain of the p-channel MOSFET (MP7), the gate thereof connected to the gate of the n-channel MOSFET (MN9) and the source thereof connected to the drain of the n-channel MOSFET (MN4). Thus, the n-channel MOSFET (MN10) is connected to the n-channel MOSFET (MN9) in a current mirror manner.

The n-channel MOSFET (MN10) can be made to have the same current density as the n-channel MOSFET (MN9).

In the first control circuit 110C, the sources of the n-channel MOSFETs (MN3 and MN4) are grounded and therefore the drain voltages of the n-channel MOSFETs (MN3 and MN4) are equal to drain-source voltages Vds3 and Vds4 of the n-channel MOSFETs (MN3 and MN4). If we denote the gate-source voltages of the n-channel MOSFETs (MN9 and MN10) as Vgs9 and Vgs10, since the gates of the n-channel MOSFETs (MN9 and MN10) are connected to each other, Vds3+Vgs9=Vds4+Vgs10. Here, when the current densities of the n-channel MOSFETs (MN9 and MN10) are equal to each other, the gate-source voltages Vgs9 and Vgs10 of the n-channel MOSFETs (MN9 and MN10) are equal to each other. Therefore, Vds3=Vds4.

Consequently, generation of a voltage difference between the drain-source voltages Vds3 and Vds4 of the n-channel MOSFETs (MN3 and MN4) is prevented and the accuracy with which the current Ids4 that flows in the n-channel MOSFET (MN4) mirrors the current Ids3 that flows in the n-channel MOSFET (MN3) is improved. Therefore, an error in the size of the current Ids1 that flows in the p-channel MOSFET (MP1) is reduced (becomes less likely to be affected by variations in power supply voltage Vdd) and as a result an effect of preventing an error in the output current Iout with respect to variations in the power supply voltage Vdd is improved in the current output circuit 101E compared with the current output circuit 101C.

In the current output circuit 101E as well, it is possible to form the current source J2 using an n-channel MOSFET (MN8) that is connected in a current mirror manner to an n-channel MOSFET (MN3) in the second control circuit 111B, similarly to as in the second control circuit 111C illustrated in FIG. 5. Thus, the accuracy with which the output current Iout follows the reference current Iref can be improved, similarly to as in the current output circuit 101D.

Sixth Embodiment

Figure 7:
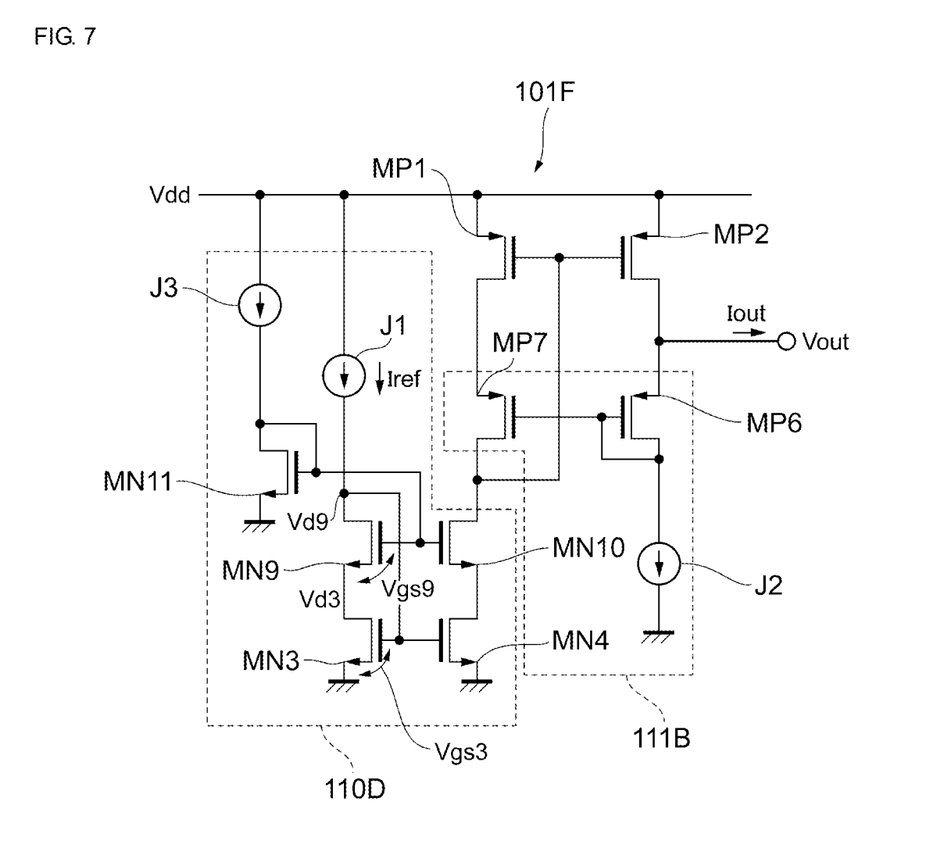
FIG. 7 is a circuit diagram of a current output circuit according to a sixth embodiment of the present disclosure.

FIG. 7 illustrates a current output circuit 101F as an example of the current output circuit 101. Elements that are the same as those of the current output circuit 101E are denoted by the same symbols and description thereof is omitted. The current output circuit 101F includes a first control circuit 110D instead of the first control circuit 110C of the current output circuit 101E.

The configuration of the first control circuit 110D differs from that of the first control circuit 110C illustrated in FIG. 6 in that the first control circuit 110D further includes a current source J3 and an n-channel MOSFET (MN11).

The first control circuit 110D forms a low-voltage cascode connection. Specifically, the n-channel MOSFET (MN11) (eleventh FET) has a constant current generated by the current source J3 supplied to the drain thereof, the gate thereof is connected to the drain thereof and the source thereof is grounded. In addition, the gates of the n-channel MOSFETs (MN9 and MN10) are connected to the drain of the n-channel MOSFET (MN11). The gates of the n-channel MOSFETs (MN3 and MN4) are connected to the drain of the n-channel MOSFET (MN9).

Next, the lowest necessary voltage value VddE of the power supply voltage in the first control circuit 110C illustrated in FIG. 6 will be considered. The voltage value VddE needs to be higher than a drain voltage Vd9 of the n-channel MOSFET (MN9). Here, the drain voltage Vd9 is equal to the gate voltage of the n-channel MOSFET (MN9), that is, has a voltage value (Vd3+Vgs9) obtained by adding the gate-source voltage Vgs9 of the n-channel MOSFET (MN9) to the drain voltage Vd3 of the n-channel MOSFET (MN3). In addition, since the source of the n-channel MOSFET (MN3) is grounded, the drain voltage Vd3 is equal to a gate-source voltage Vgs3 of the n-channel MOSFET (MN3). Therefore, the lowest necessary voltage value VddE is equal to the drain voltage Vd9 (=Vgs3+Vgs9)+$V_{J1}$. Here, the voltage $V_{J1}$ is the lowest voltage at which the current source J1 can operate.

On the other hand, in the case of the first control circuit 110D illustrated in FIG. 7, the drain voltage Vd9 of the n-channel MOSFET (MN9) is equal to the gate voltage of the n-channel MOSFET (MN3), that is, the gate-source voltage Vgs3 of the n-channel MOSFET (MN3). In addition, the drain voltage of the n-channel MOSFET (MN11) has a voltage value (Vd3+Vgs9) obtained by adding the gate-source voltage Vgs9 of the n-channel MOSFET (MN9) to the drain voltage Vd3 of the n-channel MOSFET (MN3). Therefore, when VddF is the lowest necessary voltage value of the power supply voltage, the voltage value VddF is the higher one among Vgs3+$V_{J1}$ and Vd3+Vgs9+$V_{J3}$. Here, the voltage $V_{J3}$ is the lowest voltage at which the current source J3 can operate. Since the drain voltage Vd3 can be lower than the gate-source voltage Vgs3, the voltage value VddF can be lower than the voltage value VddE.

Therefore, the current output circuit 101F can operate with a lower power supply voltage than the current output circuit 101E.

In the current output circuit 101F as well, it is possible to form the current source J2 using an n-channel MOSFET (MN8) that is connected to an n-channel MOSFET (MN3) in a current mirror manner in the second control circuit 111B, similarly to as in the second control circuit 111C illustrated in FIG. 5. Thus, the accuracy with which the output current Iout follows the reference current Iref can be improved, similarly to as in the current output circuit 101D.

Exemplary embodiments of the present disclosure have been described above. The current output circuit 101A to 101F each include a first control circuit that controls the gate voltages of the p-channel MOSFETs (MP1 and MP2) that are connected to each other in a current mirror manner and a second control circuit that maintains the drain voltages of the p-channel MOSFETs (MP1 and MP2) so as to be equal to each other. The drain voltage of the p-channel MOSFET (MP1) is controlled so as to be at the same potential as the drain voltage of the p-channel MOSFET (MP2) by the second control circuit even when the power supply voltage Vdd varies. Therefore, it is easy to maintain the drain-source voltages Vds1 and Vds2 of the p-channel MOSFETs (MP1 and MP2) at the same potential.

In addition, the drain-source voltage Vds1 of the p-channel MOSFET (MP1) also decreases with a decrease in the drain-source voltage Vds2 of the p-channel MOSFET (MP2) due to the control performed by the second control circuit. However, with respect to the decrease in the drain-source voltage Vds1, the first control circuit controls the gate voltages of the p-channel MOSFET (MP1) and the p-channel MOSFET (MP2) when a larger current flows in the p-channel MOSFET (MP1). Thus, a decrease in the output current Iout is prevented and the current supply performance of the p-channel MOSFET (MP2) is easily secured.

Therefore, with the current output circuits 101A to 101F, a current can be stably output regardless of variations in the power supply voltage Vdd.

Furthermore, the current output circuit 101D further includes the n-channel MOSFET (MN8) in the second control circuit 111C in contrast to the second control circuit 111B. Thus, the size of the current Ids6 that flows in the p-channel MOSFET (MP6) is adjusted in accordance with changes in the reference current Iref and the size of the current Ids2 that flows in the p-channel MOSFET (MP2) also changes. Therefore, the current densities of the p-channel MOSFETs (MP6 and MP7) are the same and the drain voltages of the p-channel MOSFETs (MP1 and MP2) come closer to being at the same potential. In addition, since the current Ids2 and the current Ids6 change such that a ratio therebetween remains constant, the accuracy with which the output current Iout follows the reference current Iref can be improved compared with the current output circuit 101C.

Furthermore, the current output circuit 101E further includes the n-channel MOSFETs (MN9 and MN10) in the first control circuit 110C, in contrast to the first control circuit 110B. Thus, generation of a voltage difference between the drain-source voltages Vds3 and Vds4 of the n-channel MOSFETs (MN3 and MN4) is prevented and the accuracy with which the current Ids4 that flows in the n-channel MOSFET (MN4) mirrors the current Ids3 that flows in the n-channel MOSFET (MN3) is improved. Therefore, in the current output circuit 101E, the effect of preventing an error in the output current Iout with respect to variations in the power supply voltage Vdd is improved compared with the current output circuit 101C.

Furthermore, the current output circuit 101F further includes the n-channel MOSFET (MN11) in the first control circuit 110D in contrast to the first control circuit 110C. As a result, the lowest necessary voltage value of the power supply voltage is reduced. Therefore, the current output circuit 101F can operate with a lower power supply voltage than the current output circuit 101E.

In the current output circuits illustrated in FIGS. 1 to 7, an n-channel MOSFET may be used instead of a p-channel MOSFET and a p-channel MOSFET may be used instead of an n-channel MOSFET as appropriate.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of present disclosure so long as the combined elements have the characteristics of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A current output circuit comprising:
    a first field-effect transistor (FET), wherein a power supply voltage is supplied to a source of the first FET, a first voltage is supplied to a gate of the first FET, and a first current is output from a drain of the first FET;
    a second FET, wherein the power supply voltage is supplied to a source of the second FET, the first voltage is supplied to a gate of the second FET, and an output current is output from a drain of the second FET;
    a first control circuit that controls the first voltage such that the first current is at a target level; and
    a second control circuit that makes a drain voltage of the first FET equal to a drain voltage of the second FET,
    wherein the first control circuit includes:
        a third FET, wherein a third voltage is supplied to a gate of the third FET and a second current is output from a source of the third FET, and
        a fourth FET, wherein a gate of the fourth FET is connected to the gate of the third FET, and
    wherein the first voltage is equal to a drain voltage of the fourth FET.

2. The current output circuit according to claim 1, wherein the second control circuit includes:
    a sixth FET, wherein a drain of the sixth FET and a gate of the sixth FET are connected to each other and a third current is output from the drain of the sixth FET, and
    a seventh FET, wherein a gate of the seventh FET is connected to the gate of the sixth FET and the seventh FET has the same current density as the sixth FET,
    wherein a source of the sixth FET is connected to the drain of the second FET, and
    a source of the seventh FET is connected to the drain of the first FET.

3. The current output circuit according to claim 2, wherein the second control circuit includes an eighth FET, wherein a gate of the eighth FET is connected to the gate of the third FET and a drain of the eighth FET is connected to the drain of the sixth FET.

4. The current output circuit according to claim 2, wherein the first control circuit includes:
    a ninth FET, wherein a drain and a gate of the ninth FET are connected to each other, and
    a tenth FET, wherein a gate of the tenth FET is connected to a gate of the ninth FET and the tenth FET has the same current density as the ninth FET,
    wherein a source of the ninth FET is connected to a drain of the third FET,
    wherein a source of the tenth FET is connected to a drain of the fourth FET, and
    wherein the first voltage is a drain voltage of the tenth FET.

5. The current output circuit according to claim 3, wherein the first control circuit includes:
    a ninth FET, wherein a drain and a gate of the ninth FET are connected to each other, and
    a tenth FET, wherein a gate of the tenth FET is connected to a gate of the ninth FET and the tenth FET has the same current density as the ninth FET,
    wherein a source of the ninth FET is connected to a drain of the third FET, wherein a source of the tenth FET is connected to a drain of the fourth FET, and
wherein the first voltage is a drain voltage of the tenth FET.

6. The current output circuit according to claim 4,
wherein the first control circuit includes an eleventh FET,
    wherein a drain and a gate of the eleventh FET are connected to each other,
wherein the gate of the ninth FET is connected to the drain of the eleventh FET, and
wherein the gate of the third FET is connected to the drain of the ninth FET.

7. A power amplification module comprising:
the current output circuit according to claim 1;
a first bipolar transistor that amplifies an input signal and outputs an amplified signal; and
a bias circuit that supplies a bias current to a base of the first bipolar transistor based on the output current output from the current output circuit.

8. A power amplification module comprising:
the current output circuit according to claim 2;
a first bipolar transistor that amplifies an input signal and outputs an amplified signal; and
a bias circuit that supplies a bias current to a base of the first bipolar transistor based on the output current output from the current output circuit.

9. A power amplification module comprising:
the current output circuit according to claim 3;
a first bipolar transistor that amplifies an input signal and outputs an amplified signal; and
a bias circuit that supplies a bias current to a base of the first bipolar transistor based on the output current output from the current output circuit.

10. A power amplification module comprising:
the current output circuit according to claim 4;
a first bipolar transistor that amplifies an input signal and outputs an amplified signal; and
a bias circuit that supplies a bias current to a base of the first bipolar transistor based on the output current output from the current output circuit.

11. The power amplification module according to claim 7,
wherein the bias circuit includes:
    a voltage output circuit that is supplied with the output current and outputs a fourth voltage of a prescribed level, and
    a second bipolar transistor, wherein the fourth voltage and the output current are supplied to a base of the second bipolar transistor, and the bias current is output from an emitter of the second bipolar transistor.

12. A current output circuit comprising:
a first field-effect transistor (FET), wherein a power supply voltage is supplied to a source of the first FET, a first voltage is supplied to a gate of the first FET, and a first current is output from a drain of the first FET;
a second FET, wherein the power supply voltage is supplied to a source of the second FET, the first voltage is supplied to a gate of the second FET, and an output current is output from a drain of the second FET;
a first control circuit that controls the first voltage such that the first current is at a target level; and
a second control circuit that makes a drain voltage of the first FET equal to a drain voltage of the second FET,
wherein the first control circuit includes a first operational amplifier that controls the first voltage such that the first current is at the target level based on a reference voltage corresponding to the target level and a second voltage corresponding to the first current,
wherein the second control circuit includes:
    a sixth FET, wherein a drain of the sixth FET and a gate of the sixth FET are connected to each other and a third current is output from the drain of the sixth FET, and
    a seventh FET, wherein a gate of the seventh FET is connected to the gate of the sixth FET and the seventh FET has the same current density as the sixth FET,
wherein a source of the sixth FET is connected to the drain of the second FET, and
wherein a source of the seventh FET is connected to the drain of the first FET.

13. The current output circuit according to claim 12,
wherein an output of the first operational amplifier is supplied to the gate of the first FET.

14. A power amplification module comprising:
the current output circuit according to claim 12;
a first bipolar transistor that amplifies an input signal and outputs an amplified signal; and
a bias circuit that supplies a bias current to a base of the first bipolar transistor based on the output current output from the current output circuit.

* * * * *